United States Patent
Jung et al.

(10) Patent No.: US 7,889,585 B2
(45) Date of Patent: Feb. 15, 2011

(54) BALANCING A SIGNAL MARGIN OF A RESISTANCE BASED MEMORY CIRCUIT

(75) Inventors: Seong-Ook Jung, San Diego, CA (US); Jisu Kim, Seoul (KR); Jee-Hwan Song, Seoul (KR); Seung H. Kang, San Diego, CA (US); Sei Seung Yoon, San Diego, CA (US); Mehdi Hamidi Sani, Rancho Santa Fe, CA (US)

(73) Assignees: QUALCOMM Incorporated, San Diego, CA (US); Industry-Academic Cooperation Foundation, Yonsei U, Seoul (KR)

( * ) Notice: Subject to any disclaimer, the term of this patent is extended or adjusted under 35 U.S.C. 154(b) by 231 days.

(21) Appl. No.: 12/338,297

(22) Filed: Dec. 18, 2008

(65) Prior Publication Data
US 2010/0157654 A1 Jun. 24, 2010

(51) Int. Cl.
*G11C 7/00* (2006.01)
(52) U.S. Cl. .................. 365/207; 365/208; 365/210
(58) Field of Classification Search ............... 365/207, 365/208, 210, 158, 189.15
See application file for complete search history.

(56) References Cited

U.S. PATENT DOCUMENTS

| | | | | |
|---|---|---|---|---|
| 6,625,057 | B2 * | 9/2003 | Iwata | 365/158 |
| 6,946,882 | B2 * | 9/2005 | Gogl et al. | 327/53 |
| 2005/0276091 | A1 * | 12/2005 | Inoue | 365/148 |
| 2008/0253217 | A1 * | 10/2008 | Taeuber et al. | 365/230.06 |

* cited by examiner

*Primary Examiner*—Son Dinh
(74) *Attorney, Agent, or Firm*—Sam Talpalatsky; Nicholas J. Pauley; Peter Kamarchik

(57) ABSTRACT

A resistance based memory circuit is disclosed. The circuit includes a first transistor load of a data cell and a bit line adapted to detect a first logic state. The bit line is coupled to the first transistor load and coupled to a data cell having a magnetic tunnel junction (MTJ) structure. The bit line is adapted to detect data having a logic one value when the bit line has a first voltage value, and to detect data having a logic zero value when the bit line has a second voltage value. The circuit further includes a second transistor load of a reference cell. The second transistor load is coupled to the first transistor load, and the second transistor load has an associated reference voltage value. A characteristic of the first transistor load, such as transistor width, is adjustable to modify the first voltage value and the second voltage value without substantially changing the reference voltage value.

25 Claims, 13 Drawing Sheets

BALANCING A SIGNAL MARGIN OF A RESISTANCE BASED MEMORY CIRCUIT

FIELD

The present disclosure is generally related to source degeneration and balancing a signal margin of a resistance based memory circuit.

DESCRIPTION OF RELATED ART

Advances in technology have resulted in smaller and more powerful personal computing devices. For example, there currently exist a variety of portable computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. However, power consumption of such portable computing devices can quickly deplete a battery and diminish a user's experience.

Reducing power consumption has led to smaller circuitry feature sizes and operating voltages within such portable devices. Reduction of feature sizes and operating voltages, while reducing power consumption, also increases sensitivity to noise and to manufacturing process variations. Such increased sensitivity to noise and process variations may be difficult to overcome when designing memory devices that use sense amplifiers.

SUMMARY

Research conducted by Professor Seong-Ook Jung, Jisu Kim, and Jee-Hwan Song of Yonsei University, in conjunction with Seung H. Kang, Sei Seung Yoon and Mehdi Sani of Qualcomm Inc., has resulted in novel systems and methods of source degeneration and balancing signal margin of resistance based memory circuits. Sensing margin may be improved by using a source degeneration method. Signal margin may be balanced by adjusting a width of a load transistor component of a first transistor load, by adjusting a width of a source degeneration transistor component of a first transistor load, or by a combination of both.

In a particular embodiment, a circuit is disclosed. The circuit includes a first transistor load of a data cell and a bit line coupled to the first transistor load and coupled to a data cell having a magnetic tunnel junction (MTJ) structure. During a read operation, the bit line has a first voltage value when the MTJ structure has a first logic state and a second voltage value when the MTJ structure has a second logic state. The circuit further includes a second transistor load of a reference cell. The second transistor load is coupled to the first transistor load, and the second transistor load has an associated reference voltage value. A characteristic of the first transistor load, such as transistor width, is adjustable to modify the first voltage value and the second voltage value without substantially changing the reference voltage value.

In another particular embodiment, the circuit includes a first transistor load of a data cell and a bit line coupled to a data cell having a magnetic tunnel junction (MTJ) structure. The bit line is adapted to detect data having a logic one value when the bit line has a first voltage value and to detect data having a logic zero value when the bit line has a second voltage value. The circuit further includes a second transistor load of a reference cell. The second transistor load is coupled to the first transistor load, and the second transistor load has an associated reference voltage value. The first transistor load includes at least one source degeneration transistor.

In another particular embodiment, a method of configuring a sense amplifier is disclosed. The method includes measuring a first read margin of a data cell having a magnetic tunnel junction (MTJ) structure, measuring a second read margin of the data cell having the MTJ structure, and balancing the first read margin and the second read margin by adjusting a characteristic of a transistor load coupled to the data cell.

In another particular embodiment, an amplifier is disclosed. The amplifier includes a bit line coupled to read first data of a first resistance based memory cell with a first read margin and to read second data of the first resistance based memory cell with a second read margin. A transistor load is coupled to the bit line. A characteristic of the transistor load is adjusted to balance the first read margin or the second read margin.

One particular advantage provided by at least one of the disclosed embodiments is that operation of a resistance based memory may be improved by increasing a signal margin of the resistance based memory. The increased signal margin may improve a tolerance of the resistance based memory to noise or to process variation during read operations. Improved signal margin may also lead to improved memory device yield.

Other aspects, advantages, and features of the present disclosure will become apparent after review of the entire application, including the following sections: Brief Description of the Drawings, Detailed Description, and the Claims.

DETAILED DESCRIPTION

Figure 1:
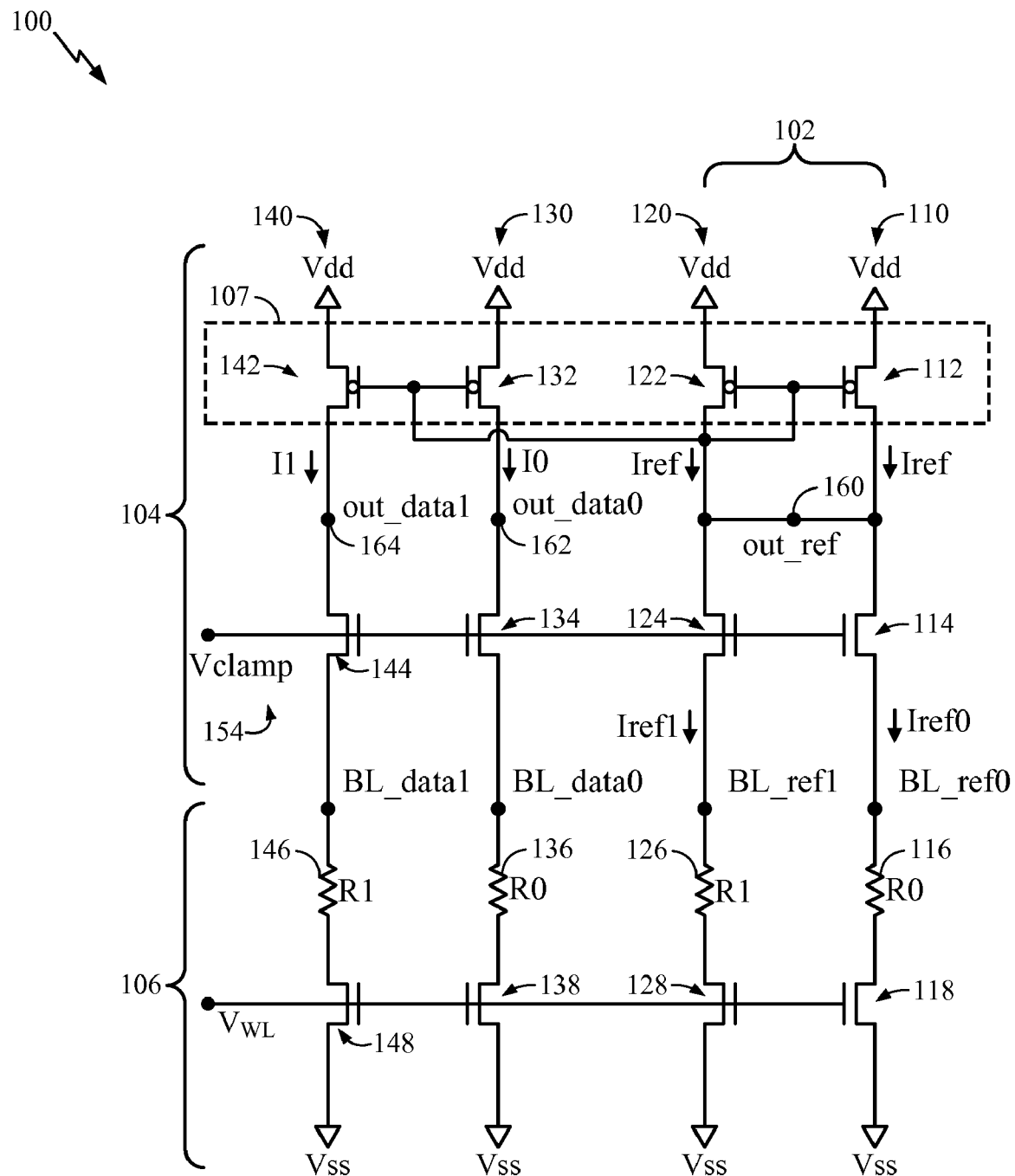
FIG. 1 is a circuit diagram of a first illustrative embodiment of a resistance based memory including a transistor load.

Referring to FIG. 1, a particular illustrative embodiment of a resistance based memory including a transistor load 107 is depicted and generally designated 100. The memory 100 includes a reference circuit 102 having a first reference path 110 and a second reference path 120. The memory 100 also includes a representative logic bit-zero data path 130 and a representative logic bit-one data path 140. The representative logic bit-zero data path 130 includes a first bit line adapted to read a logic zero value, and the representative logic bit-one data path 140 includes a second bit line adapted to read a logic one value. Transistor load 107 is coupled to the first bit line, to the second bit line, and to reference paths 110 and 120. The reference paths 110 and 120 and the data paths 130 and 140 are generally designated as having a sense amplifier portion 104 that provides load elements to a memory cell portion 106 to generate an output signal for comparison at a second sense amplifier (not shown). In a particular embodiment, the memory 100 is a magnetoresistive random access memory (MRAM), a phase-change random access memory (PRAM), or a spin torque transfer MRAM (STT-MRAM).

The first reference path 110 includes a load device, such as a p-channel metal oxide semiconductor (PMOS) field effect transistor load 112. The PMOS load 112 is coupled to a reference node (out_ref) 160, which in turn is coupled to a clamp transistor 114. A resistance R0 116 corresponding to a logic "zero" state of a resistance based memory element is coupled to the clamp transistor 114. A resistance based memory element is a device having a first resistance corresponding to a logic "one" value and a second resistance corresponding to a logic "zero" value, such as a magnetic tunnel junction (MTJ) device or a PRAM memory cell as illustrative, non-limiting examples. An access transistor 118 is coupled to the resistance R0 116.

The second reference path 120 includes a load device, such as a PMOS load 122. The PMOS load 122 is coupled to the reference node (out_ref) 160, which in turn is coupled to a clamp transistor 124. A resistance R1 126 corresponding to a logic "one" state of a resistance based memory element is coupled to the clamp transistor 124. An access transistor 128 is coupled to the resistance R1 126. The representative logic bit-zero data path 130 includes a load device, such as a PMOS load 132. The PMOS load 132 is coupled to a reference node (out_data0) 162, which in turn is coupled to a clamp transistor 134. A resistance based memory element having a logic "zero" state is represented as a resistance R0 136, which is coupled to the clamp transistor 134. An access transistor 138 is coupled to the resistance R0 136.

The representative logic bit-one data path 140 includes a load device, such as a PMOS load 142. The PMOS load 142 is coupled to a reference node (out_data1) 164, which in turn is coupled to a clamp transistor 144. A resistance based memory element having a logic "one" state is represented as a resistance R1 146, which is coupled to the clamp transistor 144. An access transistor 148 is coupled to the resistance R1 146.

Generally, corresponding components of each of the paths 110, 120, 130, 140 may have similar configurations and may operate in a substantially similar manner. Each of the clamp transistors 114, 124, 134, and 144 functions to limit current and voltage through the respective paths 110, 120, 130, and 140 based on a signal Vclamp 154. Vclamp 154 represents a common gate voltage that enables the clamp transistors 114, 124, 134, and 144 to function as clamping transistors. Each of the access transistors 118, 128, 138, and 148 selectively allows current flow through the respective paths 110, 120, 130, and 140 based on a common signal $V_{WL}$ that represents a common gate voltage to the access transistors 118, 128, 138, and 148. Each of the PMOS load devices 112, 122, 132, and 142 has a gate terminal that is coupled to the out_ref node 160 such that a gate voltage equals a voltage Vref at the out_ref node 160.

Performing statistical analysis of a population of memory devices may enable a designer to address process variations (especially in a sense amplifier) which tend to increase with technology scaling. In a particular embodiment, a signal margin $\Delta V$, such as a sense amplifier margin, corresponds to a difference between a voltage $V_1$ at the out_data1 node 164 and a voltage Vref at the out_ref node 160 ($\Delta V_1$), or a difference between a voltage Vref at the out_ref node 160 and a voltage $V_0$ at the out_data0 node 162 ($\Delta V_0$), whichever is smallerBy balancing a first read margin $\Delta V_0$ and a second read margin $\Delta V_1$, the signal margin $\Delta V$ may be improved. By improving signal margin $\Delta V$, memory device yield may be improved. A designer may take (mean−N*sigma) of $\Delta V_0$ and $\Delta V_1$ as a representative statistical value, where the value of N is chosen to achieve a desired yield.

Since a gate voltage of load transistors 112, 122, 132, and 142 is equal to Vref, shifting Vref without shifting $V_0$ and $V_1$ is not possible. However, varying a width of data cell PMOS loads 132 and 142 allows shifting of $V_0$ and $V_1$ without shifting Vref, which in turn enables balancing of $\Delta V_0$ and $\Delta V_1$. In an illustrative embodiment, increasing a width of PMOS loads 132 and 142 increases $V_0$ and $V_1$, while decreasing a width of PMOS loads 132 and 142 decreases $V_0$ and $V_1$. After a width of PMOS loads 132 and 142 are adjusted, a first statistical value corresponding to a first mean value and a first standard deviation value of the first read margin may be balanced with a second statistical value corresponding to a second mean value and a second standard deviation value of the second read margin. For example, if the width of PMOS loads 132 and 142 is decreased, Vout_ref (Vref) remains substantially unchanged, but Vout_data0 ($V_0$) and Vout_data1 ($V_1$) are decreased. As a result, $\Delta V_0$ (Vref−$V_0$) increases and $\Delta V_1$ ($V_1$−Vref) decreases, thereby balancing $\Delta V_0$ and $\Delta V_1$ and improving signal margin $\Delta V$ in a case where $\Delta V_1$ was previously greater than $\Delta V_0$. Therefore, varying a width of data cell PMOS loads 132 and 142 may enable a designer of the memory 100 to adjust circuit parameters in a manner that satisfies design constraints while enabling the signal margin $\Delta V$ to approach a physically theoretical maximum value given the design constraints while also improving memory device yield.

Figure 2:
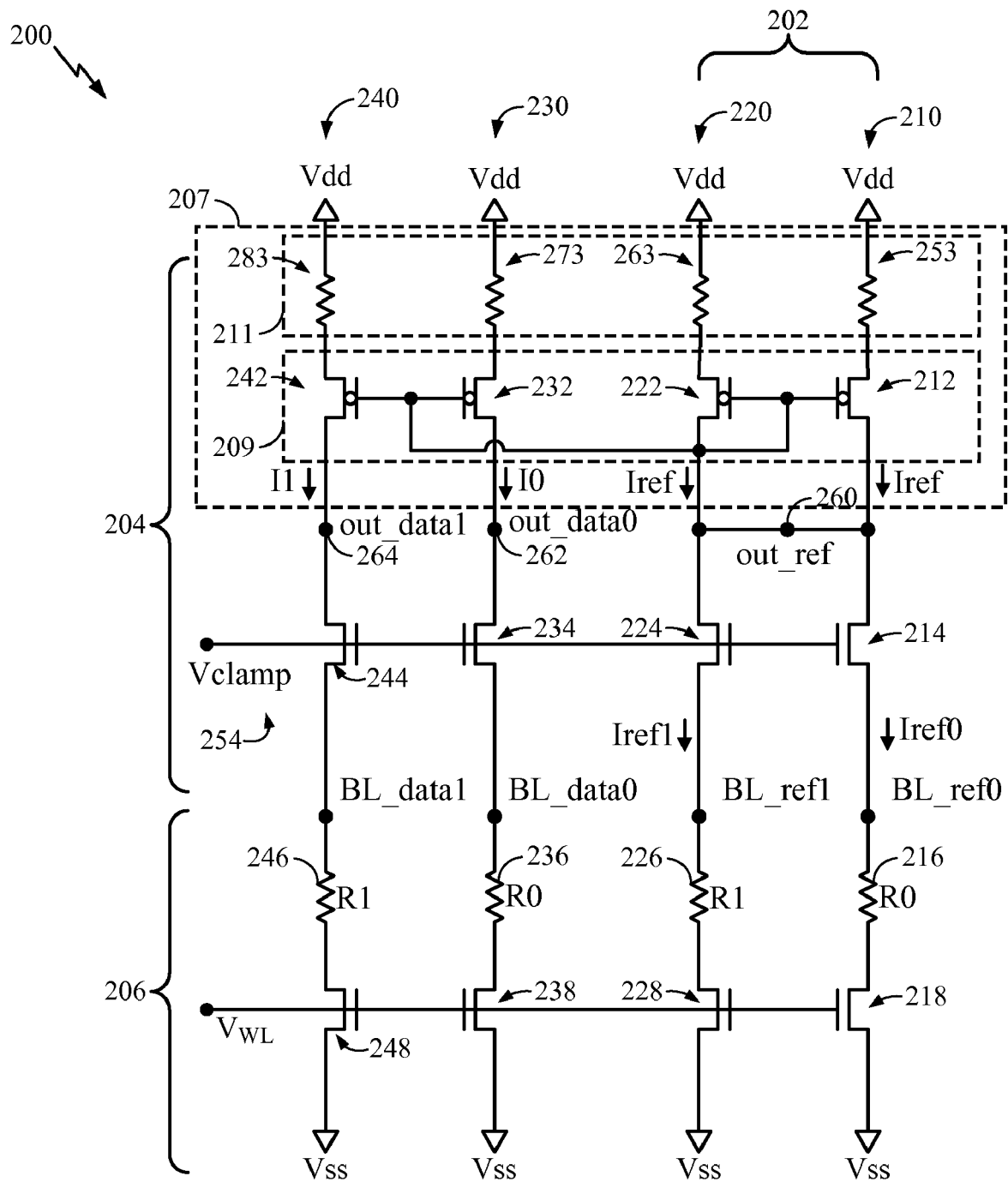
FIG. 2 is a circuit diagram of a second illustrative embodiment of a resistance based memory including a transistor load with source resistance.

Referring to FIG. 2, a particular illustrative embodiment of a resistance based memory including a transistor load 207 with source degeneration is depicted and generally designated 200. The transistor load 207 includes a load transistor component 209 and a source resistance component 211. The memory 200 includes a reference circuit 202 having a first reference path 210 and a second reference path 220. The memory 200 also includes a representative logic bit-zero data path 230 and a representative logic bit-one data path 240. The reference paths 210 and 220 and the data paths 230 and 240 are generally designated as having a sense amplifier portion 204 that provides load elements to a memory cell portion 206 to generate an output signal for comparison at a second sense amplifier (not shown). In a particular embodiment, the memory 200 is a magnetoresistive random access memory (MRAM), a phase-change random access memory (PRAM), or a spin torque transfer MRAM (STT-MRAM).

The first reference path 210 includes a source resistance device 253. The source resistance device 253 is coupled to a load device 212, such as a p-channel metal oxide semiconductor (PMOS) field effect transistor load. The PMOS load 212 is coupled to a reference node (out_ref) 260, which in turn is coupled to a clamp transistor 214. A resistance R0 216 corresponding to a logic "zero" state of a resistance based memory element is coupled to the clamp transistor 214. A resistance based memory element is a device having a first resistance corresponding to a logic "one" value and a second resistance corresponding to a logic "zero" value, such as a magnetic tunnel junction (MTJ) device or a PRAM memory cell as illustrative, non-limiting examples. An access transistor 218 is coupled to the resistance R0 216.

The second reference path 220 includes a source resistance device 263. The source resistance device 263 is coupled to a load device 222, such as a PMOS load. The PMOS load 222 is coupled to the reference node (out_ref) 260, which in turn is coupled to a clamp transistor 224. A resistance R1 226 corresponding to a logic "one" state of a resistance based memory element is coupled to the clamp transistor 224. An access transistor 228 is coupled to the resistance R1 226.

The representative logic bit-zero data path 230 includes a source resistance device 273. The source resistance device 273 is coupled to a load device 232, such as a PMOS load. The PMOS load 232 is coupled to a reference node (out_data0) 262, which in turn is coupled to a clamp transistor 234. A resistance based memory element having a logic "zero" state is represented as a resistance R0 236, which is coupled to the clamp transistor 234. An access transistor 238 is coupled to the resistance R0 236.

The representative logic bit-one data path 240 includes a source resistance device 283. The source resistance device 283 is coupled to a load device 242, such as a PMOS load 242. The PMOS load 242 is coupled to a reference node (out_data1) 264, which in turn is coupled to a clamp transistor 244. A resistance based memory element having a logic "one" state is represented as a resistance R1 246, which is coupled to the clamp transistor 244. An access transistor 248 is coupled to the resistance R1 246.

Generally, corresponding components of each of the paths 210, 220, 230, 240 may have similar configurations and may operate in a substantially similar manner. Each of the clamp transistors 214, 224, 234, and 244 functions to limit current and voltage through the respective paths 210, 220, 230, and 240 based on a signal Vclamp 254. Vclamp 254 represents a common gate voltage that enables the clamp transistors 214, 224, 234, and 244 to function as clamping transistors. Each of the access transistors 218, 228, 238, and 248 selectively allows current flow through the respective paths 210, 220, 230, and 240 based on a common signal $V_{WL}$ that represents a common gate voltage to the access transistors 218, 228, 238, and 248. Each of the PMOS load devices 212, 222, 232, and 242 has a gate terminal that is coupled to the out_ref node 260 such that a gate voltage equals a voltage Vref at the out_ref node 260. In an exemplary embodiment, each of the source resistance devices 253, 263, 273 and 283 may be a ground gated PMOS field effect transistor load.

In a particular embodiment, a signal margin $\Delta V$, such as a sense amplifier margin, corresponds to a difference between a voltage $V_1$ at the out_data1 node 264 and a voltage Vref at the out_ref node 260 ($\Delta V_1$), or a difference between a voltage Vref at the out_ref node 260 and a voltage $V_0$ at the out_data0 node 262 ($\Delta V_0$), whichever is smaller. By balancing $\Delta V_0$ and $\Delta V_1$, the signal margin $\Delta V$ may be improved. By improving signal margin $\Delta V$, memory device yield may be improved. Statistical analysis may be applied when balancing $\Delta V_0$ and $\Delta V_1$ to address process variations which tend to increase with technology scaling. As described above, statistical analysis may report mean (i.e. average) and sigma (i.e. standard deviation) values of measured variables $\Delta V_0$ and $\Delta V_1$.

The source resistance component 211 is coupled between the load transistor component 209 and power Vdd to increase bias stability with process variations. As an illustrative example, if current through the load transistor component 209 increases due to process variations, the voltage drop across the source resistance component 211 increases, which results in a reduction of source-to-gate voltage $V_{SG}$ of the load transistor component 209. This reduced $V_{SG}$ restricts current increase through the load transistor component 209. In addition, an effective output resistance of the load transistor component 209 increases, where effective output resistance may be defined as 1/(slope of load line of load transistor component). By adding source resistance, current variation is substantially reduced and effective resistance is increased, leading to improved signal margin as more fully described and illustrated with reference to FIGS. 8-11

Figure 3:
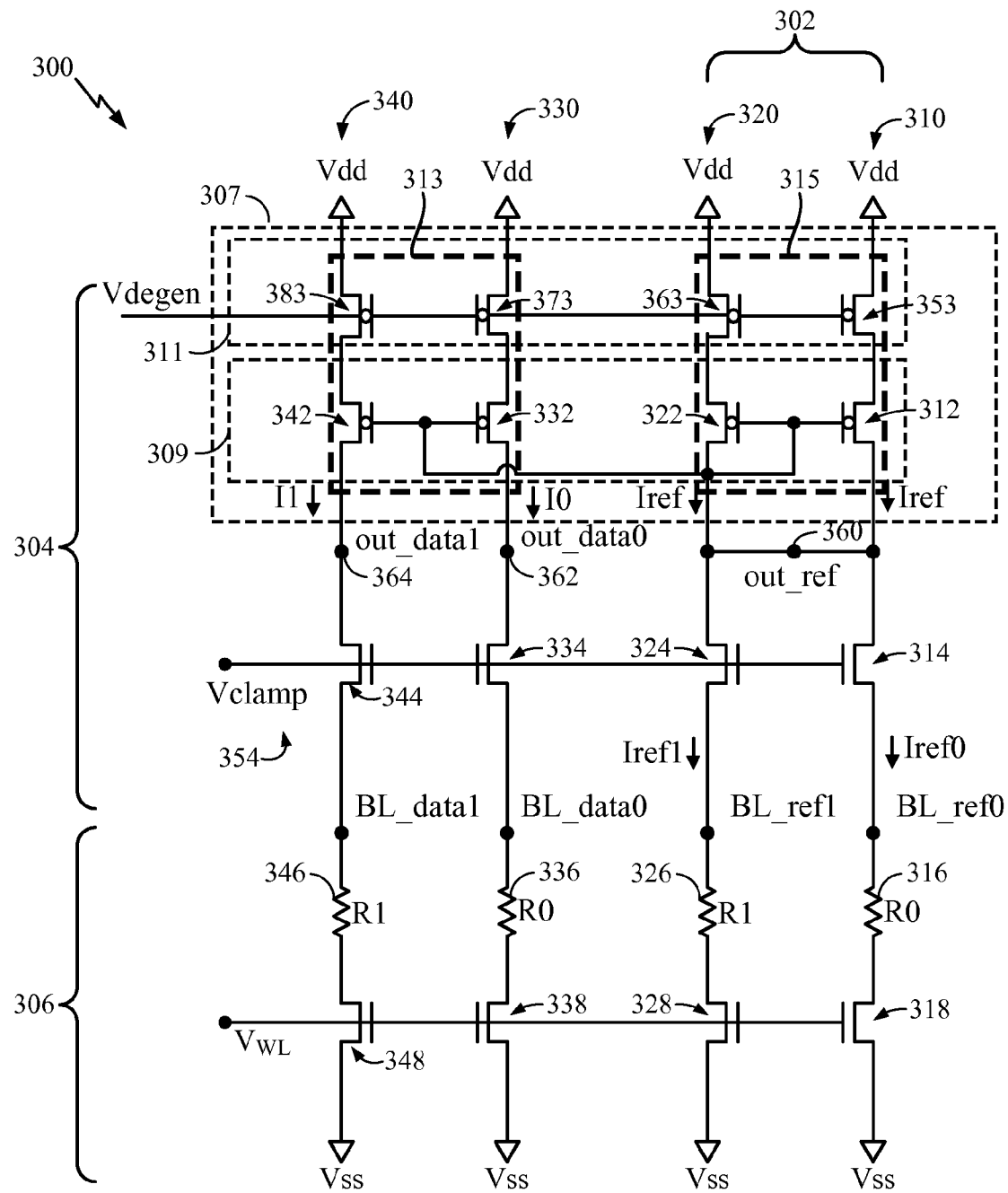
FIG. 3 is a circuit diagram of a third illustrative embodiment of a resistance based memory including a transistor load with source degeneration.

Referring to FIG. 3, a particular illustrative embodiment of a resistance based memory including a transistor load 307 with source degeneration is depicted and generally designated 300. The transistor load 307 includes a load transistor component 309 and a source degeneration component 311. The transistor load 307 further includes a first transistor load 313 of a data cell coupled to a second transistor load 315 of a reference cell. The first transistor load 313 may include at least one source degeneration transistor, such as 373, 383, and at least one load transistor, such as 332, 342. The data cell may have a magnetic tunnel junction (MTJ) structure as may be represented by 336, 346. The second transistor load 315 may include at least one source degeneration transistor, such as 353, 363, and at least one load transistor, such as 312, 322. The reference cell may have a magnetic tunnel junction (MTJ) structure as may be represented by 316, 326. Generally, the first transistor load 313 and the second transistor load 315 may be adjusted to enable a designer of the memory 300 to adjust circuit parameters in a manner that satisfies design constraints while enabling the signal margin $\Delta V$ to approach a physically theoretical maximum value given the design constraints while also improving memory device yield.

The memory 300 includes a reference circuit 302 having a first reference path 310 and a second reference path 320. The memory 300 also includes a representative logic bit-zero data path 330 and a representative logic bit-one data path 340. The representative logic bit-zero data path 330 includes a first bit line adapted to detect a first logic state, and the representative logic bit-one data path 340 includes a second bit line adapted to detect a second logic state. The first transistor load 313 is coupled to the first bit line and to the second bit line. The second transistor load 315 is coupled to the first transistor load 313. The reference paths 310 and 320 and the data paths 330 and 340 are generally designated as having a sense amplifier portion 304 that provides load elements to a memory cell portion 306 to generate an output signal for comparison at a second sense amplifier (not shown). In a particular embodiment, the memory 300 is a magnetoresistive random access memory (MRAM), a phase-change random access memory (PRAM), or a spin torque transfer MRAM (STT-MRAM).

The first reference path 310 includes a source degeneration device, such as a p-channel metal oxide semiconductor (PMOS) field effect transistor load 353. The source degeneration device 353 is coupled to a load device, such as a PMOS load 312, and to power Vdd to increase bias stability with process variations. As an illustrative example, if current through the PMOS load 312 increases due to process variations, the voltage drop across the source degeneration device 353 increases, which results in a reduction of source to gate voltage $V_{SG}$ of the PMOS load 312. This reduced $V_{SG}$ restricts current increase through the PMOS load 312. In addition, effective output resistance of the PMOS load 312 increases, leading to improved signal margin as more fully described and illustrated with reference to FIGS. 8-11. The PMOS load 312 is coupled to a reference node (out_ref) 360, which in turn is coupled to a clamp transistor 314. A resistance R0 316 corresponding to a logic "zero" state of a resistance based memory element is coupled to the clamp transistor 314. A resistance based memory element is a device having a first resistance corresponding to a logic "one" value and a second resistance corresponding to a logic "zero" value, such as a magnetic tunnel junction (MTJ) device or a PRAM memory cell as illustrative, non-limiting examples. An access transistor 318 is coupled to the resistance R0 316.

The second reference path 320 includes a source degeneration device, such as a PMOS load 363. The source degeneration device 363 is coupled to a load device, such as a PMOS load 322. The PMOS load 322 is coupled to the reference node (out_ref) 360, which in turn is coupled to a clamp transistor 324. A resistance R1 326 corresponding to a logic "one" state of a resistance based memory element is coupled to the clamp transistor 324. An access transistor 328 is coupled to the resistance R1 326.

The representative logic bit-zero data path 330 includes a source degeneration device, such as a PMOS load 373. The source degeneration device 373 is coupled to a load device, such as a PMOS load 332. The PMOS load 332 is coupled to a reference node (out_data0) 362, which in turn is coupled to a clamp transistor 334. A resistance based memory element having a logic "zero" state is represented as a resistance R0 336, which is coupled to the clamp transistor 334. An access transistor 338 is coupled to the resistance R0 336.

The representative logic bit-one data path 340 includes a source degeneration device, such as a PMOS load 383. The source degeneration device 383 is coupled to a load device, such as a PMOS load 342. The PMOS load 342 is coupled to a reference node (out_data1) 364, which in turn is coupled to a clamp transistor 344. A resistance based memory element having a logic "one" state is represented as a resistance R1 346, which is coupled to the clamp transistor 344. An access transistor 348 is coupled to the resistance R1 346.

Generally, corresponding components of each of the paths 310, 320, 330, 340 may have similar configurations and may operate in a substantially similar manner. Each of the clamp transistors 314, 324, 334, and 344 functions to limit current and voltage through the respective paths 310, 320, 330, and 340 based on a signal Vclamp 354. Vclamp 354 represents a common gate voltage that enables the clamp transistors 314, 324, 334, and 344 to function as clamping transistors. Each of the access transistors 318, 328, 338, and 348 selectively allows current flow through the respective paths 310, 320, 330, and 340 based on a common signal $V_{WL}$ that represents a common gate voltage to the access transistors 318, 328, 338, and 348. Each of the PMOS load devices 312, 322, 332, and 342 has a gate terminal that is coupled to the out_ref node 360 such that a gate voltage equals a voltage Vref at the out_ref node 360. Each of the source degeneration devices 353, 363, 373, and 383 functions to limit current and voltage through the respective paths 310, 320, 330, and 340 based on a signal Vdegen that represents a common gate voltage to the source degeneration devices 353, 363, 373, and 383. During a read operation, Vdegen is low and provides negative feedback to PMOS load devices 312, 322, 332, and 342. During non-read operation, Vdegen is high and selectively gates off source degeneration devices 353, 363, 373, and 383 to reduce leakage current.

In a particular embodiment, a signal margin ΔV, such as a sense amplifier margin, corresponds to a difference between a voltage at the out_data1 node 364 and a voltage at the out_ref node 360 ($\Delta V_1$), or a difference between a voltage at the out_ref node 360 and a voltage at the out_data0 node 362 ($\Delta V_0$), whichever is smaller. As described above, statistical analysis may be applied when balancing $\Delta V_0$ and $\Delta V_1$ to address process variations which tend to increase with technology scaling. Statistical analysis may report mean (i.e. average) and sigma (i.e. standard deviation) values of the measured variables $\Delta V_0$ and $\Delta V_1$. Varying a width of the PMOS loads 332 and 342, or varying a width of the source degeneration devices 373 and 383, based on one or more design constraints may enable a designer of the memory 300 to adjust circuit parameters in a manner that satisfies design constraints while enabling the signal margin ΔV to be increased and to approach a physically theoretical maximum value given the design constraints. In addition, by adding source degeneration devices 353, 363, 373, and 383, current variation may be substantially reduced and effective resistance increased, leading to improved signal margin as more fully described and illustrated with reference to FIGS. 8-11.

Figure 4:
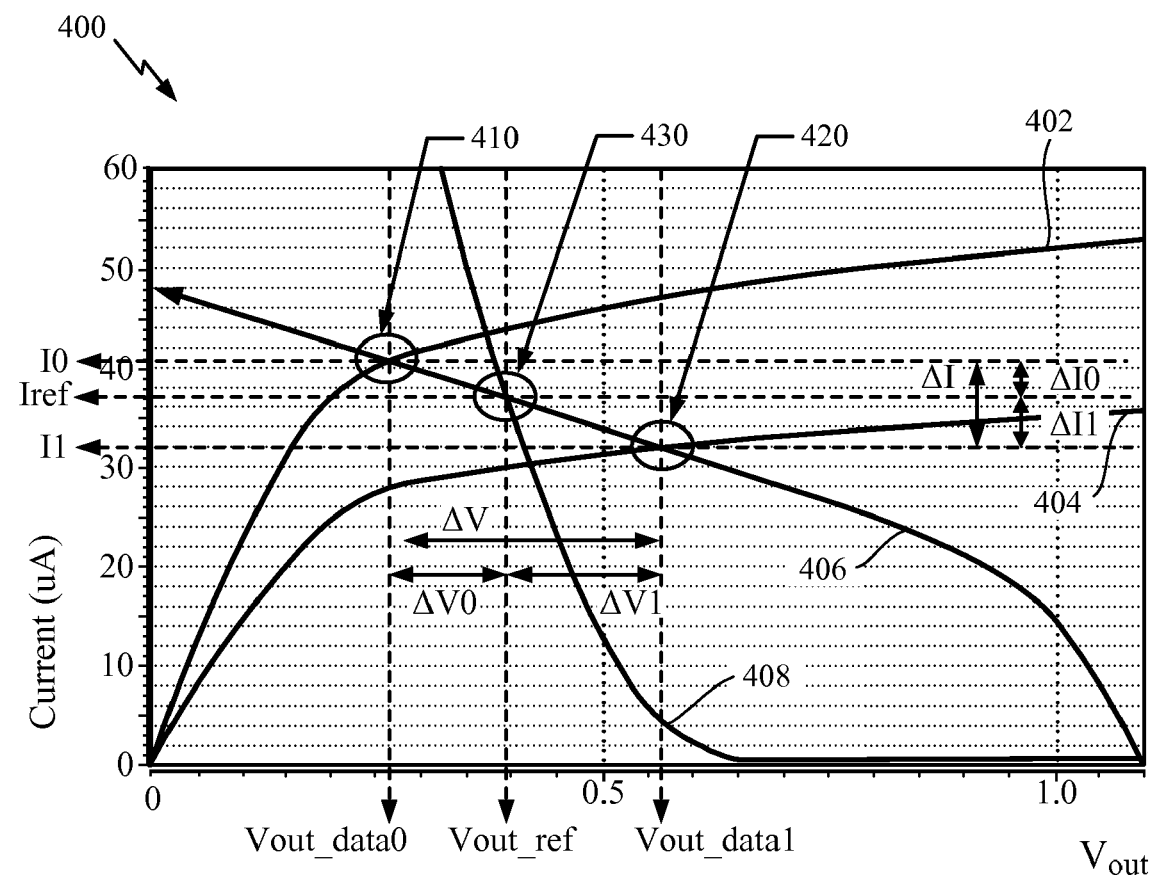
FIG. 4 is a diagram of a particular illustrative embodiment of operational parameter values associated with load line characteristics of the reference circuit depicted in FIG. 1.

Referring to FIG. 4, a particular illustrative embodiment of operational parameter values associated with load line characteristics of the reference circuit depicted in FIG. 1 is depicted and generally designated 400. A first curve 402 illustrates a first current I0 through the logic bit-zero path 130 or Iref0 through the first reference path 110 of FIG. 1, including the access transistor 138 or 118, the memory element 136 or 116, and the clamp transistor 134 or 114, without the PMOS load 132 or 112, respectively, referred to as 'logic "zero" bottom-side circuit.' A second curve 404 illustrates a second current I1 through the logic bit-one path 140 or Iref1 through the second reference path 120, including the access transistor 148 or 128, the memory element 146 or 126, and the clamp transistor 144 of 124 without the PMOS load 142 or 122, referred to as 'logic "one" bottom-side circuit.'

A third curve 406 illustrates current through the PMOS load 132 or 142 as a function of a voltage at the out_data0 node 162 or out_data1 node 164, respectively, referred to as the "top-side data circuit". A fourth curve 408 illustrates a current Iref through the PMOS loads 112 and 122 of the reference circuit 102 of FIG. 1 as a function of a voltage at the out_ref node 160.

A first intersection 410 of the first curve 402 and the third curve 406 indicates a voltage (Vout_data0) at the out_data0 node 162 and a current (I0) corresponding to an operating point of the bit-zero path 130 of FIG. 1. A second intersection 420 of the second curve 404 and the third curve 406 indicates a voltage (Vout_data1) at the out_data1 node 164 and a current (I1) corresponding to an operating point of the bit-one path 140 of FIG. 1. A third intersection 430 of the third curve 406 and the fourth curve 408 indicates a voltage (Vout_ref) at the out_ref node 160 and a current (Iref) at an operating point of the reference circuit 102.

A voltage difference $\Delta V_0$ between the voltage at the out_ref node 160 (Vout_ref) and the voltage at the out_data0 node 162 (Vout_data0) indicates a tolerance of the memory 100 to noise or to process variation in detecting a logic "zero" value stored at a resistance based memory element. A voltage difference $\Delta V_1$ between the voltage at the out_data1 node 164 (Vout_data1) and the voltage at the out_ref node 160 (Vout_ref) indicates a tolerance of the memory 100 to noise or to process variation in detecting a logic "one" value stored at a resistance based memory element. The signal margin of the memory 100 is equal to $\Delta V_0$, as the smaller of $\Delta V_0$ and $\Delta V_1$. Similarly, current differences $\Delta I_0$ and $\Delta I_1$ correspond to differences between Iref and I0, and I1 and Iref, respectively.

Figure 5:
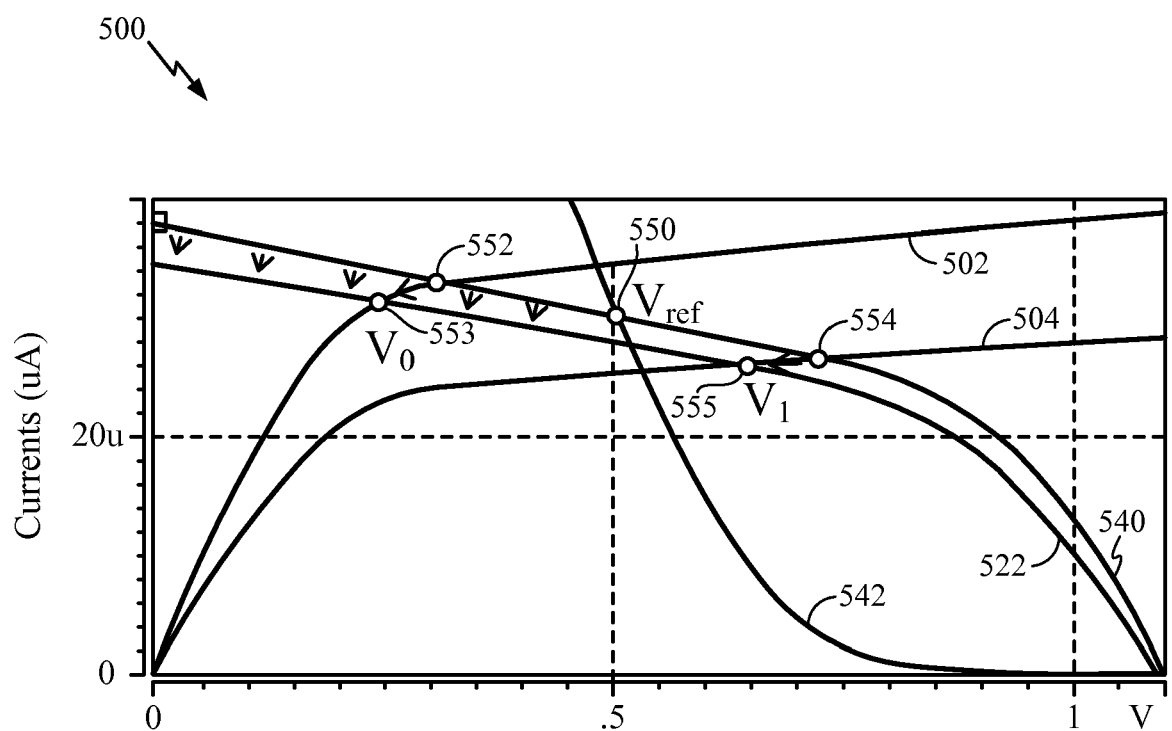
FIG. 5 is a diagram of a particular illustrative embodiment of a load line characteristic of the reference circuit depicted in FIG. 1.

Referring to FIG. 5, a particular illustrative embodiment of a load line characteristic of the resistance based memory 100 of FIG. 1 with a reduced width of a load transistor is depicted and generally designated 500. A first curve 502 and a second curve 504 illustrate current-voltage (I-V) characteristics for the logic "zero" bottom-side circuit and the logic "one" bottom-side circuit, respectively. Load lines 540 and 542 correspond to I-V characteristics of the top-side data circuit and the top-side reference circuit, respectively, with a first width of the transistor load PMOS transistors 112, 122, 132, and 142. Load lines 540 and 522 correspond to I-V characteristics of top-side data circuit for paths 130, 140 and the top-side reference circuit for the reference path 110, 120, respectively, where the transistor load PMOS transistors 132 and 142 have a second width that is smaller than the first width while the width of PMOS transistors 112 and 122 remains at the first width.

The smaller transistor width of PMOS transistors 132 and 142 causes the voltages $V_0$ and $V_1$ to decrease without changing Vout_ref. For example, an intersection 550 of the load lines 540 and 542 indicates a voltage at the out_ref node 160 of FIG. 1. At the first width of the transistor load PMOS transistors 112, 122, 132, and 142, an intersection 552 of the load line 540 and the first curve 502 indicates a logic bit "zero" output voltage, and an intersection 554 of the load line 540 and the second curve 504 indicates a logic bit "one" output voltage. At the second width of the transistor load transistors 132 and 142 (the width of PMOS transistors 112 and 122 remains at the first width), an intersection 553 of the load line 522 and the first curve 502 indicates a logic bit "zero" output voltage, and an intersection 555 of the load line 522 and the second curve 504 indicates a logic bit "one" output voltage. The voltage $V_0$ at the second width (intersection 553) is smaller than at the first width (intersection 552), increasing $\Delta V_0$ (Vref–$V_0$), and increasing the signal margin $\Delta V$. Even though the voltage $V_1$ at the second width (intersection 555) is smaller than at the first width (intersection 554), decreasing $\Delta V_1$ ($V_1$–Vref), the signal margin $\Delta V$, as smaller of $\Delta V_0$ and $\Delta V_1$, is improved since $\Delta V_0$, which is much smaller than $\Delta V_1$ with the first width, is increased. By reducing the width of transistor load PMOS transistors 132 and 142, $V_0$ and $V_1$ are reduced without change to Vout_ref. As discussed above with reference to the illustrative embodiment depicted in FIG. 4, the signal margin of the memory 100 is equal to $\Delta V_0$, as the smaller of $\Delta V_0$ and $\Delta V_1$. By reducing the values of $V_0$ and $V_1$ without change to Vout_ref, $\Delta V_0$ and $\Delta V_1$ can be substantially balanced and the signal margin is improved as illustrated in FIG. 6.

Referring to FIG. 6, diagrams of voltage characteristics of the resistance based memory 100 of FIG. 1 are depicted. In the illustrative embodiment shown in FIG. 6, representative simulation values for some of the circuit parameters are $V_{DD}$=1.1V, $R_{MTJ\_0}$=2.5K, and MR=250%. A width of load transistors 112, 122, 132 and 142 before load balancing is 0.6 um. A width of load transistors 112, 122, 132 and 142 after load balancing are as follows: a width of reference cell load transistors 112 and 122 is 0.6 um, and a width of data cell load transistors 132 and 142 is 0.58 um. FIG. 6 (a) is a histogram of a population of MRAM devices, and includes a curve 602 that depicts $\Delta V_0$ and a curve 604 that depicts $\Delta V_1$ before balancing $\Delta V_0$ and $\Delta V_1$, where $\Delta V_0$ is less than $\Delta V_1$. FIG. 6(b) is a close-up view of a portion of FIG. 6(a) to illustrate behavior of $V_0$ and $V_1$ in a voltage range that may be of interest to designers to achieve a desired yield.

Figure 6A:
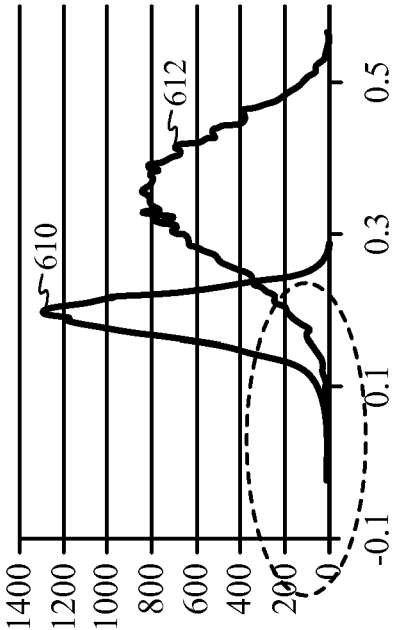
FIG. 6 includes diagrams of voltage characteristics of the resistance based memory depicted in FIG. 1.
Figure 6C:
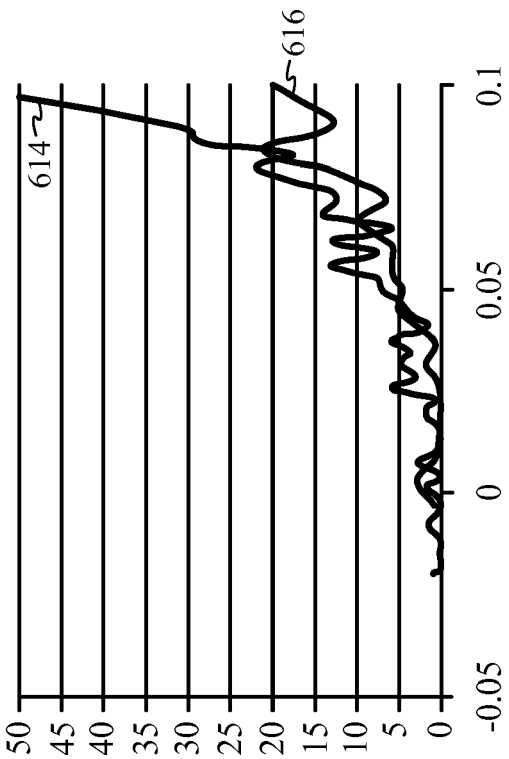
Figure 6B:
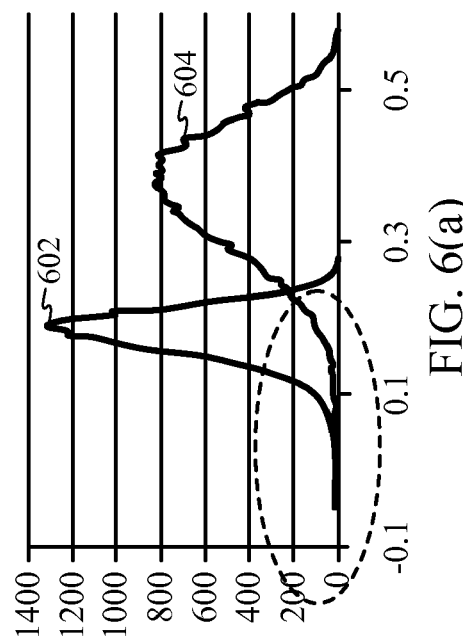
Figure 6D:
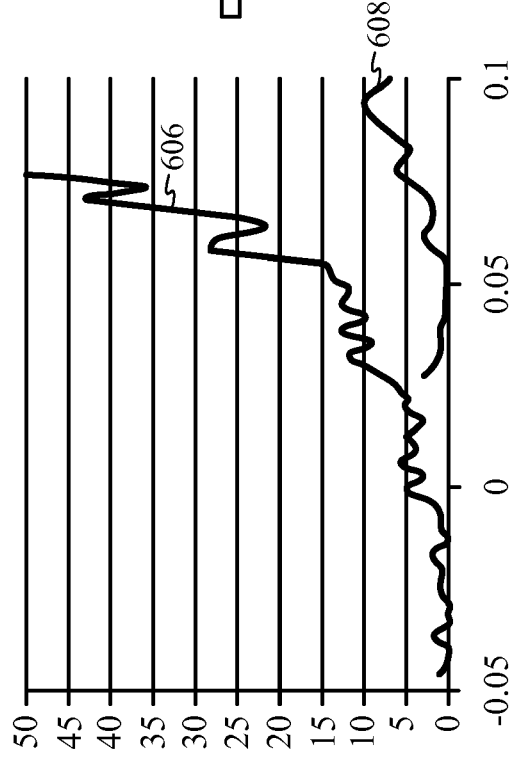

For example, the statistical value (mean–3*sigma) for curve 602 of FIG. 6(a) may be 0.073 mV and may have behavior as more clearly illustrated in FIG. 6(b), where a curve 606 depicts a first value of $\Delta V_0$ and a curve 608 depicts a second value of $\Delta V_1$ before balancing $\Delta V_0$ and $\Delta V_1$, and where the value of $\Delta V_0$ is less than value of $\Delta V_1$. FIG. 6(c) is a histogram of a population of MRAM devices, and includes a curve 610 that depicts $\Delta V_0$ and a curve 612 that depicts $\Delta V_1$ after balancing $\Delta V_0$ and $\Delta V_1$. FIG. 6(d) is a close-up view of a portion of FIG. 6(c) to illustrate behavior of $V_0$ and $V_1$ in the voltage range that may be of interest to designers described above, and includes a curve 614 that depicts a third value of $\Delta V_0$ and a curve 616 that depicts a fourth value of $\Delta V_1$ after balancing $\Delta V_0$ and $\Delta V_1$, where the third value of $\Delta V_0$ is substantially equal to the fourth value of $\Delta V_1$ as illustrated by curves 614 and 616. For example, the statistical value (mean–3*sigma) for curve 614 may be 0.094 mV, and the statistical value (mean–3*sigma) for curve 616 may be 0.095 mV.

Figure 7:
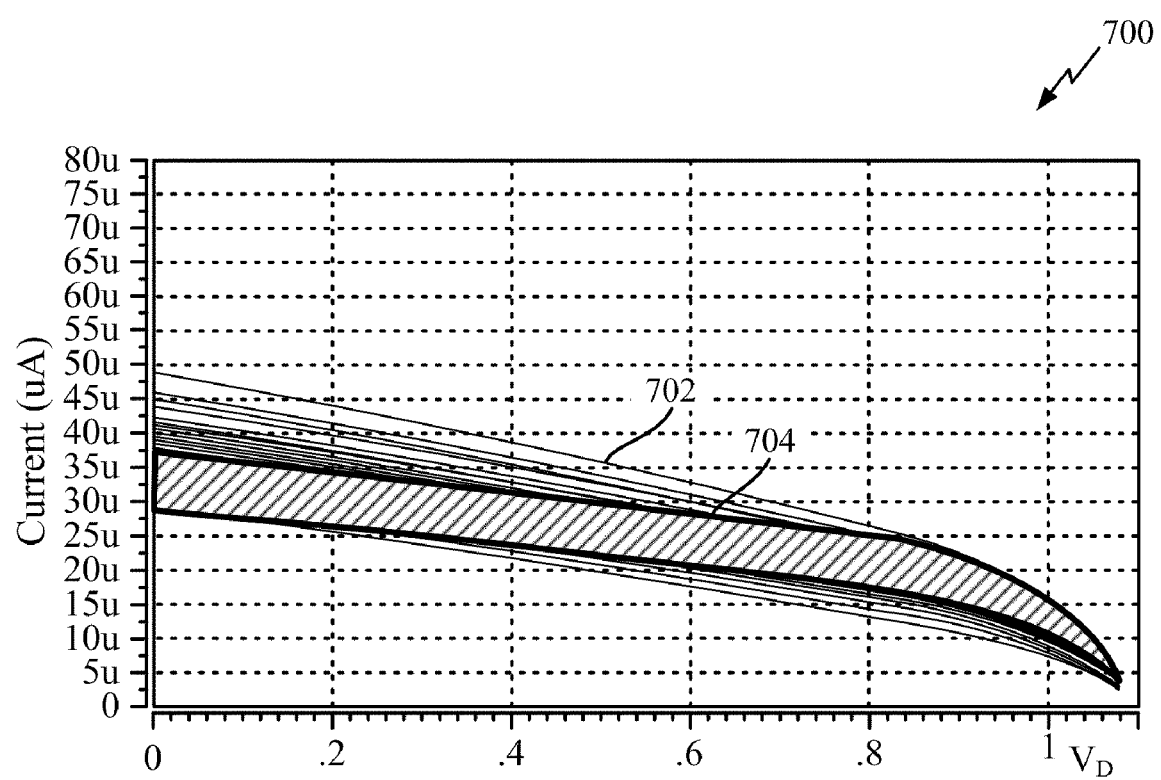
FIG. 7 is a diagram of a load line characteristic of the resistance based memory depicted in FIG. 2.

Referring to FIG. 7, a diagram of a current-voltage characteristic of a load line portion of a circuit associated with a data cell of the resistance based memory 200 of FIG. 2 is depicted and generally designated 700. A curve 702 depicts current variation of a transistor load without source resistance. A curve 704 depicts current variation of a transistor load with source resistance. Comparing curve 702 and curve 704, current variation is substantially reduced and the effective resistance is increased with the addition of source resistance.

Figure 8:
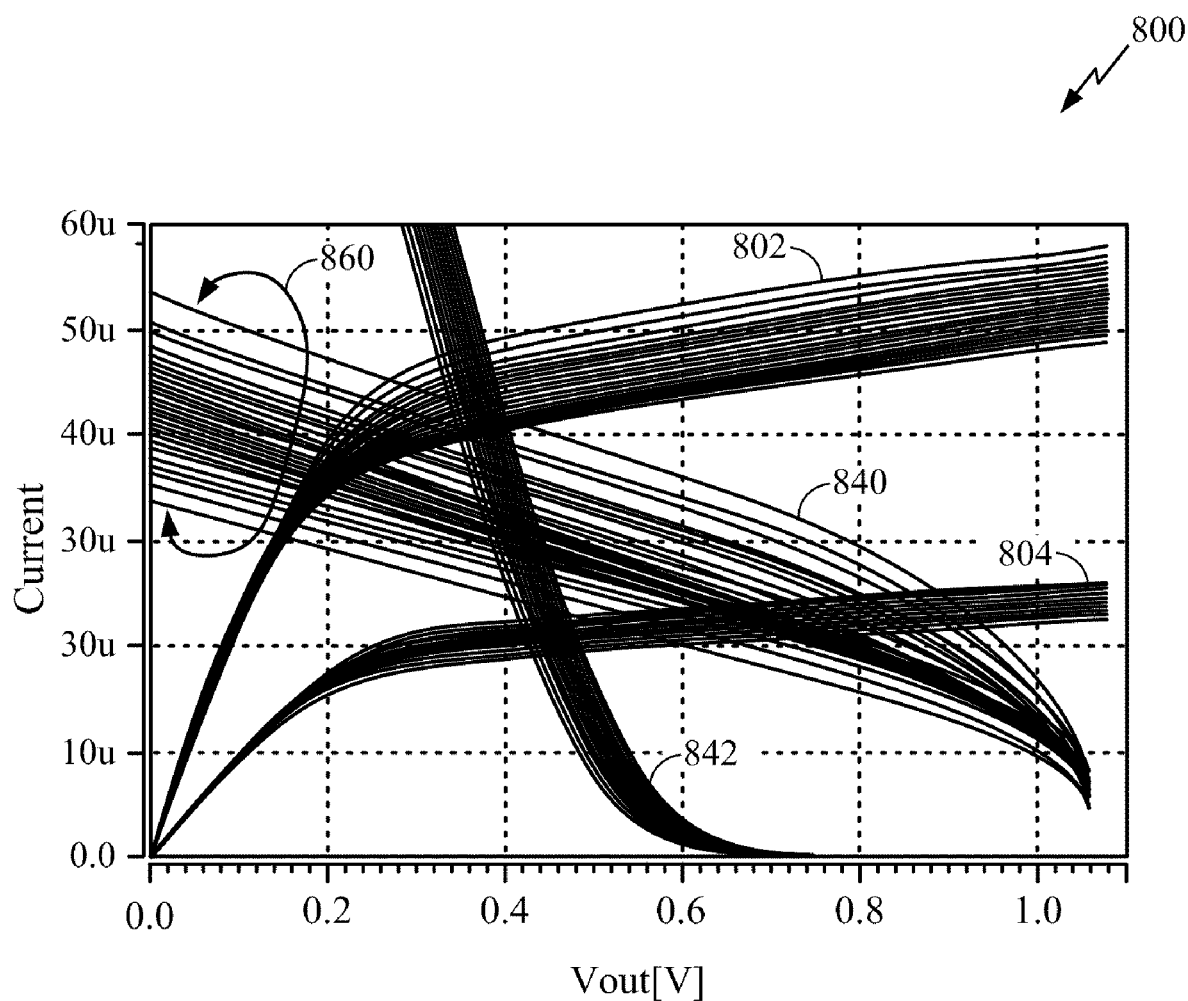
FIG. 8 is a diagram of a load line characteristic of the resistance based memory depicted in FIG. 1 without source degeneration.
Figure 9:
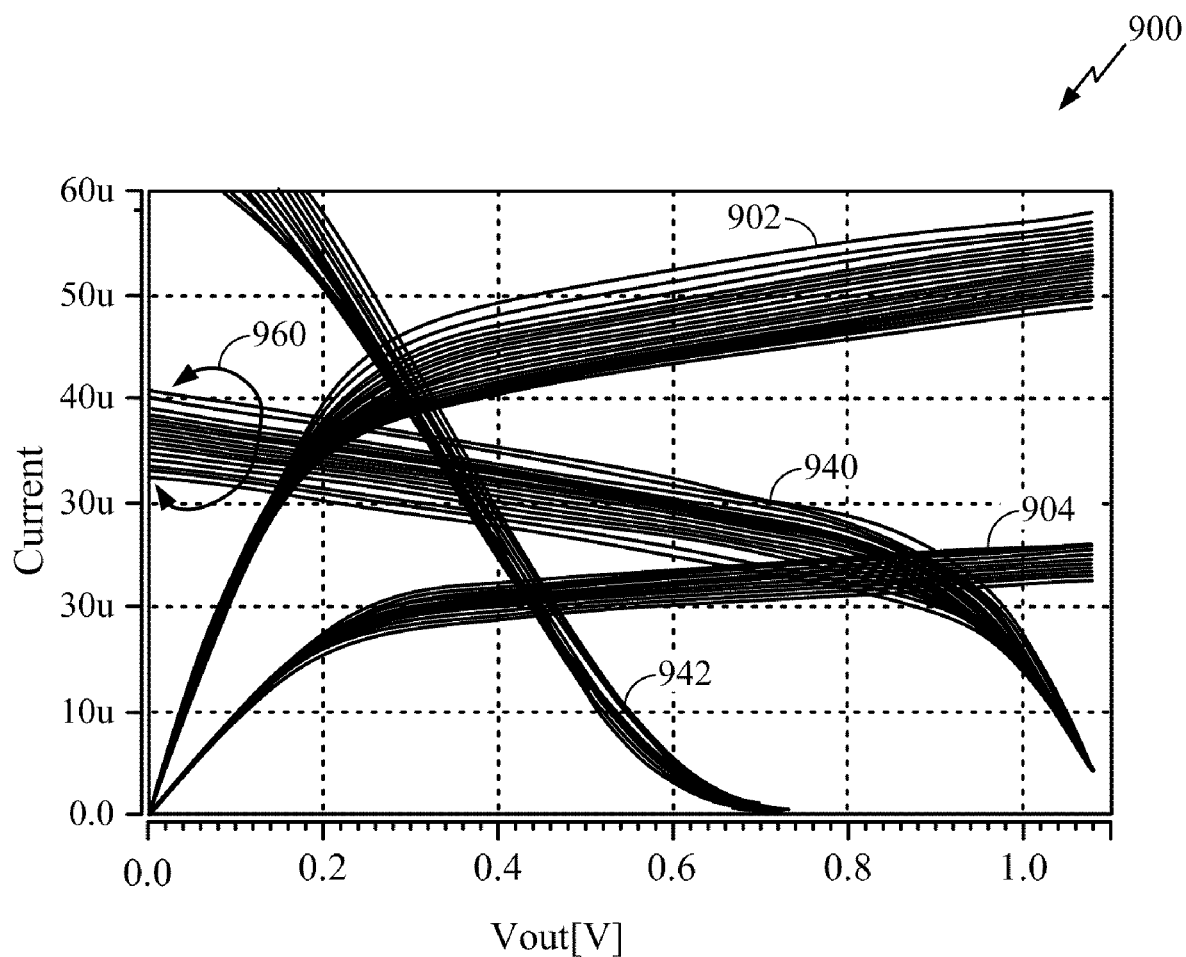
FIG. 9 is a diagram of a load line characteristic of the resistance based memory depicted in FIG. 3 with source degeneration.
Figure 10:
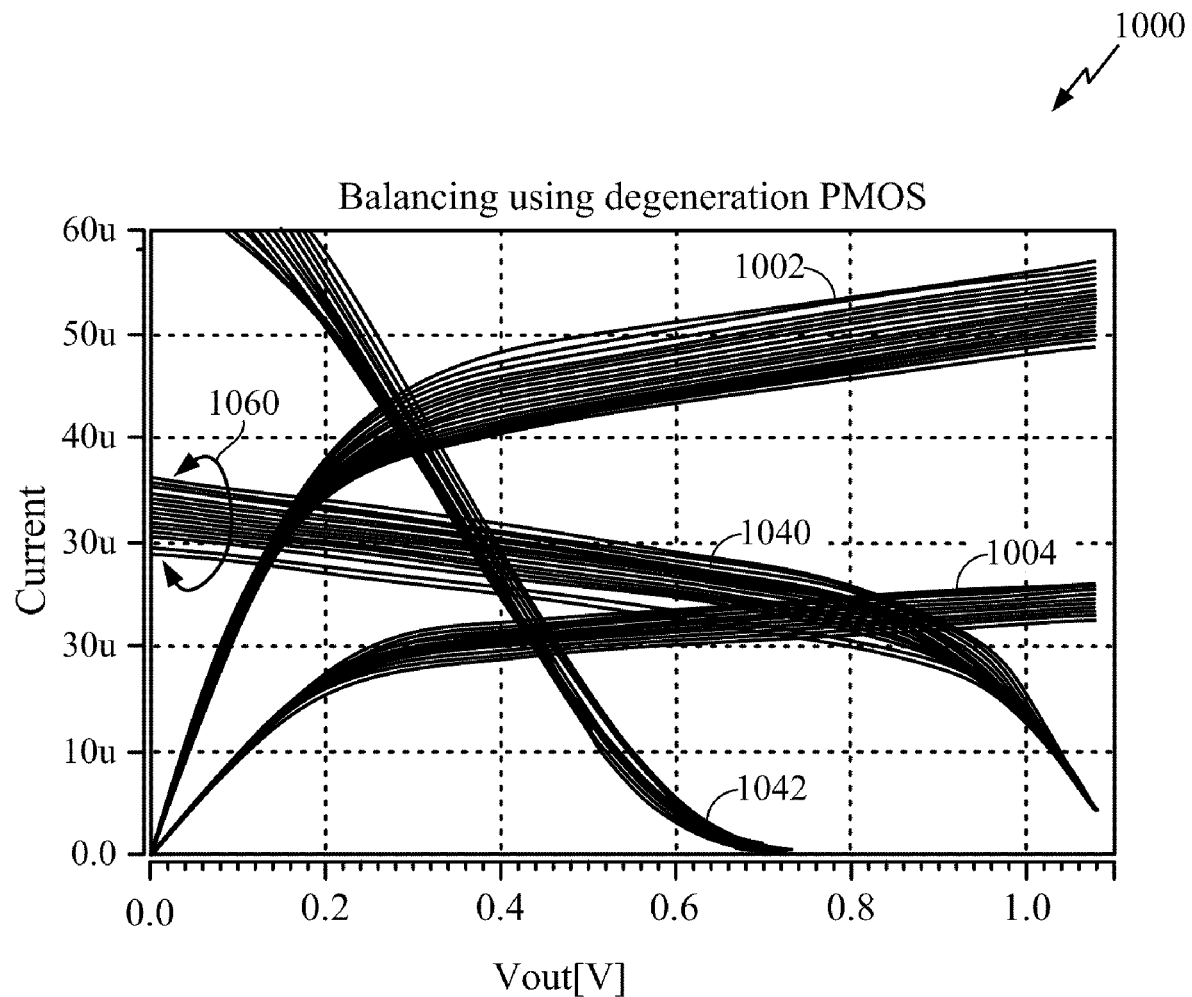
FIG. 10 is a diagram of a load line characteristic of the resistance based memory depicted in FIG. 3 with source degeneration where a width of a degeneration transistor is adjusted.
Figure 11:
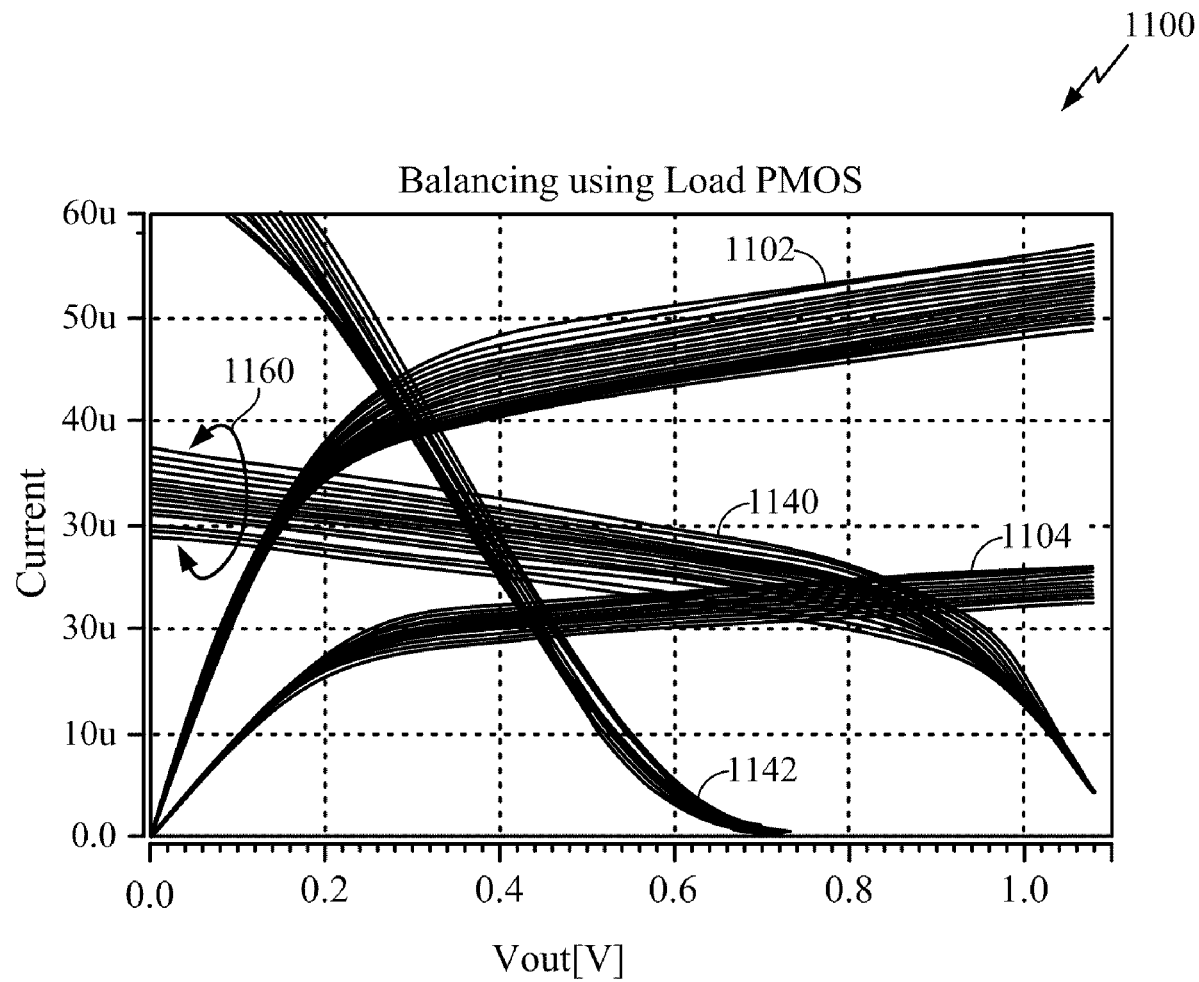
FIG. 11 is a diagram of a load line characteristic of the resistance based memory depicted in FIG. 3 with source degeneration where a width of a load portion transistor is adjusted.

FIGS. 8 and 9 depict load line characteristics of a population of MRAM devices without and with source degeneration, respectively. FIGS. 10 and 11 depict load line characteristics of a population of MRAM devices with source degeneration where a width of a source degeneration transistor component of a first transistor load is adjusted and where a width of a load transistor component of a first transistor load is adjusted, respectively.

Referring to FIG. 8, a diagram of load line characteristics of the resistance based memory 100 of FIG. 1 without source degeneration is depicted and generally designated 800. A first curve 802 and a second curve 804 illustrate current-voltage (I-V) characteristics for the logic "zero" bottom-side circuit and the logic "one" bottom-side circuit, respectively. Load line 840 corresponds to I-V characteristics of the top-side data circuit. Load line 842 corresponds to I-V characteristics of reference paths 110, 120. A region 860 generally indicates a variation in load line 840 of transistor load 107 depicted in FIG. 1. In the illustrative embodiment shown in FIG. 8, a width of load transistors 112, 122, 132 and 142 is 0.6 um; $V_{DD}$=1.1V; $R_{MTJ\_0}$=2.5K; and MR=250%. Without source degeneration, the simulated values of $\Delta V_0$ and $\Delta V_1$ are as follows: mean of $\Delta V_0$=0.193 mV; standard deviation (sigma) of $\Delta V_0$=0.045 mV; (mean–3*sigma) of $\Delta V_0$=0.057 mV; mean of $\Delta V_1$=0.342 mV; standard deviation (sigma) of $\Delta V_1$=0.085 mV; and (mean–3*sigma) of $\Delta V_1$=0.087 mV.

The signal margin $\Delta V$ is 0.057 mV (i.e. the smaller of (mean–3*sigma) of $\Delta V_0$ and (mean–3*sigma) of $\Delta V_1$).

In contrast to FIG. 8, FIG. 9 depicts load line characteristics of the resistance based memory 300 of FIG. 3 with source degeneration, generally designated 900. A first curve 902 and a second curve 904 illustrate current-voltage (I-V) characteristics for the logic "zero" bottom-side circuit and the logic "one" bottom-side circuit, respectively. Load line 940 corresponds to I-V characteristics of the top-side data circuit. Load line 942 corresponds to I-V characteristics of reference paths 310, 320. A region 960 generally indicates a variation in load line 940 of transistor load 313 depicted in FIG. 3. In the illustrative embodiment shown in FIG. 9, a width of load transistors 312, 322, 332 and 342 is 2.0 um; a width of degeneration transistors 353, 363, 373, and 383 is 0.3 um; $V_{DD}$=1.1V; $R_{MTJ\_0}$=2.5K; and MR=250%. With source degeneration, the simulated values of $\Delta V_0$ and $\Delta V_1$ are as follows: mean of $\Delta V_0$=0.189 mV; standard deviation (sigma) of $\Delta V_0$=0.019 mV; (mean–3*sigma) of $\Delta V_0$=0.133 mV; mean of $\Delta V_1$=0.493 mV; standard deviation (sigma) of $\Delta V_1$=0.053 mV; and (mean–3*sigma) of $\Delta V_1$=0.333 mV. The signal margin $\Delta V$ is 0.133 mv (i.e. the smaller of (mean–3*sigma) of $\Delta V_0$ and (mean–3*sigma) of $\Delta V_1$). Comparing the signal margin $\Delta V$ associated with the illustrative embodiment depicted in FIG. 8 (0.057 mV) with the signal margin $\Delta V$ associated with the illustrative embodiment depicted in FIG. 9 (0.133 mV), the signal margin is improved with source degeneration.

Referring to FIG. 10, a diagram of a load line characteristic of the resistance based memory 300 of FIG. 3 with source degeneration where a width of a source degeneration transistor component of a first transistor load is adjusted is depicted and generally designated 1000. A first curve 1002 and a second curve 1004 illustrate current-voltage (I-V) characteristics for the logic "zero" bottom-side circuit and the logic "one" bottom-side circuit, respectively. Load line 1040 corresponds to I-V characteristics of the top-side data circuit. Load line 1042 corresponds to I-V characteristics of reference paths 310, 320. A region 1060 generally indicates a variation in load line 1040 of transistor load 307 depicted in FIG. 3. In the illustrative embodiment shown in FIG. 10, load balancing by adjusting a width of degeneration transistors in a data cell is illustrated, where a width of load transistors 312, 322, 332 and 342 is 2.0 um; a width of degeneration transistors 353 and 363 in a reference cell is 0.3 um; a width of degeneration transistors 373 and 383 in a data cell is 0.241 um; $V_{DD}$=1.1V; $R_{MTJ\_0}$=2.5K; and MR=250%. Balancing by adjusting a width of degeneration transistors 373 and 383, the simulated values of $\Delta V_0$ and $\Delta V_1$ are as follows: mean of $\Delta V_0$=0.217 mV; standard deviation (sigma) of $\Delta V_0$=0.014 mV; (mean–3*sigma) of $\Delta V_0$=0.174 mV; mean of $\Delta V_1$=0.388 mV; standard deviation (sigma) of $\Delta V_1$=0.071 mV; and (mean–3*sigma) of $\Delta V_1$=0.175 mV. The signal margin $\Delta V$ is 0.174 mv (i.e. the smaller of (mean–3*sigma) of $\Delta V_0$ and (mean–3*sigma) of $\Delta V_1$).

Comparing the illustrative embodiment shown in FIG. 9 with the illustrative embodiment shown in FIG. 10, all circuit parameters remained constant except the width of degeneration transistors 373 and 383 was adjusted (decreased) in the embodiment shown in FIG. 10, causing mean of $\Delta V_0$ to increase (0.189 mV for FIG. 9 to 0.217 mV for FIG. 10), and mean of $\Delta V_1$ to decrease (0.493 mV for FIG. 9 to 0.388 mV for FIG. 10). Signal margin $\Delta V$ improved from 133 mV (FIG. 9) to 174 mV (FIG. 10). Balancing $\Delta V_0$ and $\Delta V_1$ by adjusting degeneration transistor width enhances sensing margin from 133 mV to 174 mV.

Referring to FIG. 11, a diagram of a load line characteristic of the resistance based memory 300 of FIG. 3 with source degeneration where a width of a load transistor component of a first transistor load is adjusted is depicted and generally designated 1100. A first curve 1102 and a second curve 1104 illustrate current-voltage (I-V) characteristics for the logic "zero" bottom-side circuit and the logic "one" bottom-side circuit, respectively. Load line 1140 corresponds to I-V characteristics of the top-side data circuit. Load line 1142 corresponds to I-V characteristics of reference paths 310, 320. A region 1160 generally indicates a variation in load line 1140 of transistor load 313 depicted in FIG. 3. In the illustrative embodiment shown in FIG. 11, load balancing by adjusting a width of load transistors in a data cell is illustrated, where a width of load transistors 312 and 322 in a reference cell is 2.0 um; a width of load transistors 332 and 342 in a data cell is 1.42 um; a width of degeneration transistors 353, 363, 373, and 383 is 0.3 um; $V_{DD}$=1.1V; $R_{MTJ\_0}$=2.5K; and MR=250%. Balancing by adjusting a width of load transistors 332 and 342, the simulated values of $\Delta V_0$ and $\Delta V_1$ are as follows: mean of $\Delta V_0$=0.212 mV; standard deviation (sigma) of $\Delta V_0$=0.016 mV; (mean–3*sigma) of $\Delta V_0$=0.165 mV; mean of $\Delta V_1$=0.379 mV; standard deviation (sigma) of $\Delta V_1$=0.072 mV; and (mean–3*sigma) of $\Delta V_1$=0.164 mV. The signal margin $\Delta V$ is 0.164 mv (i.e. the smaller of (mean–3*sigma) of $\Delta V_0$ and (mean–3*sigma) of $\Delta V_1$).

Comparing the illustrative embodiment shown in FIG. 9 with the illustrative embodiment shown in FIG. 11, all circuit parameters remained constant except the width of load transistors 332 and 342 was adjusted (decreased) in the embodiment shown in FIG. 11, causing mean of $\Delta V_0$ to increase (0.189 mV for FIG. 9 to 0.212 mV for FIG. 11), and mean of $\Delta V_1$ to decrease (0.493 mV for FIG. 9 to 0.379 mV for FIG. 11). Signal margin $\Delta V$ improved from 133 mV (FIG. 9) to 164 mV (FIG. 11). Balancing $\Delta V_0$ and $\Delta V_1$ by adjusting load transistor component transistor width enhances sensing margin from 133 mV to 164 mV.

Figure 12:
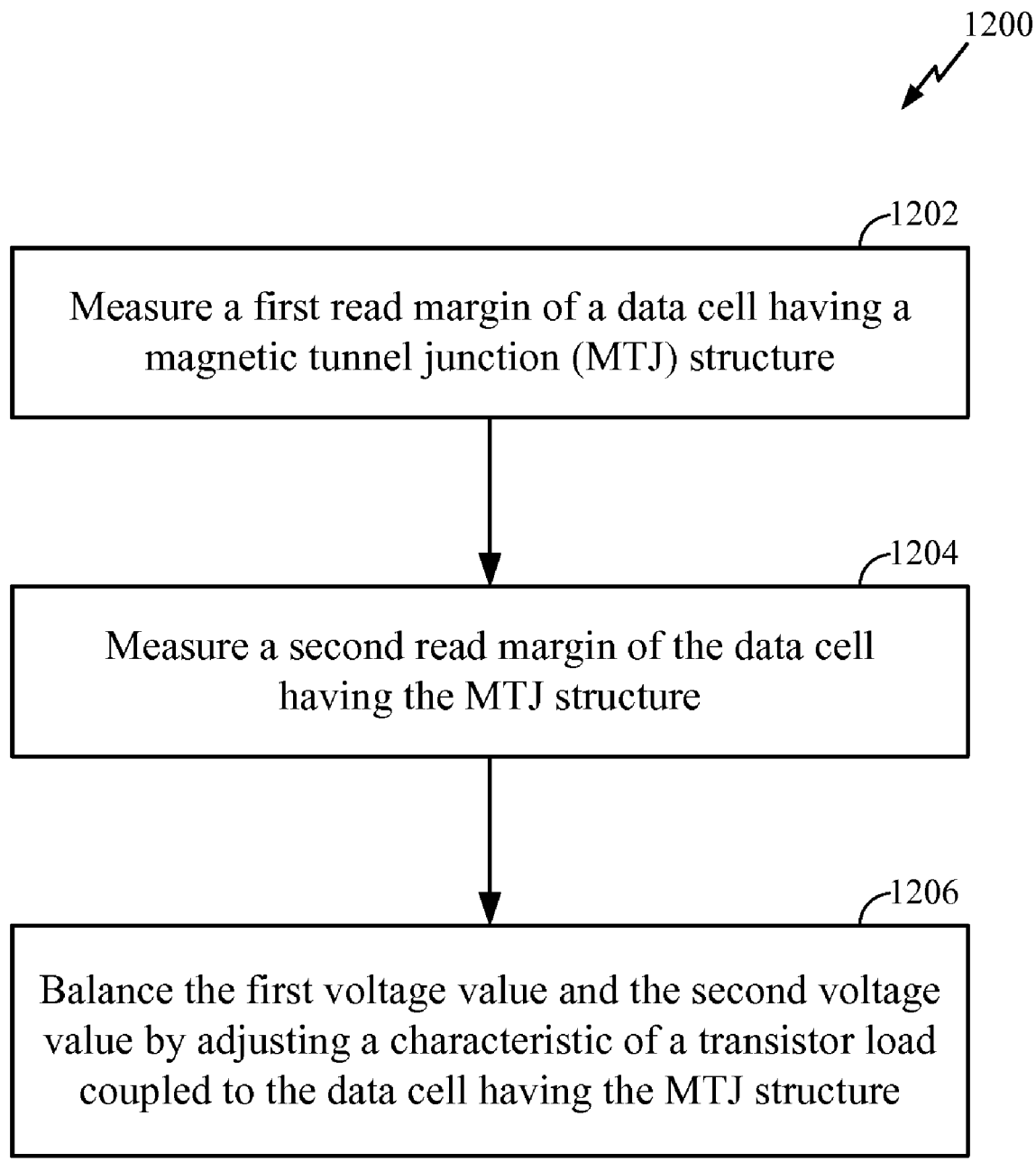
FIG. 12 is a flow chart of a particular illustrative embodiment of a method of configuring a sense amplifier.

Referring to FIG. 12, a flow diagram of a particular embodiment of a method of configuring a sense amplifier in a resistance based memory circuit is depicted and generally designated 1200. As illustrative examples, the resistance based memory circuit may include a magnetoresistive random access memory (MRAM), a phase-change random access memory (PRAM), a spin torque transfer MRAM (STT-MRAM), or other resistance based memory devices.

At 1202, a first read margin $\Delta V_0$ of a data cell having a magnetic tunnel junction structure is measured. Moving to 1204, a second read margin $\Delta V_1$ of the data cell having the magnetic tunnel junction structure is measured. Continuing to 1206, the first read margin $\Delta V_0$ and the second read margin $\Delta V_1$ are balanced by adjusting a characteristic of a transistor load coupled to the data cell having the magnetic tunnel junction structure. In a particular embodiment, the characteristic may include adjusting a load transistor width to increase a sense amplifier margin. For example, a width of a load transistor component of a first transistor load may be adjusted, or a width of a degeneration transistor in a data cell may be adjusted. The first read margin $\Delta V_0$ of the data cell and the second read margin $\Delta V_1$ of the data cell indicate a tolerance of a resistance based memory to noise or to process variation in detecting a logic value stored at a resistance based memory element. By improving sense amplifier margin, memory device yield may be improved.

Figure 13:
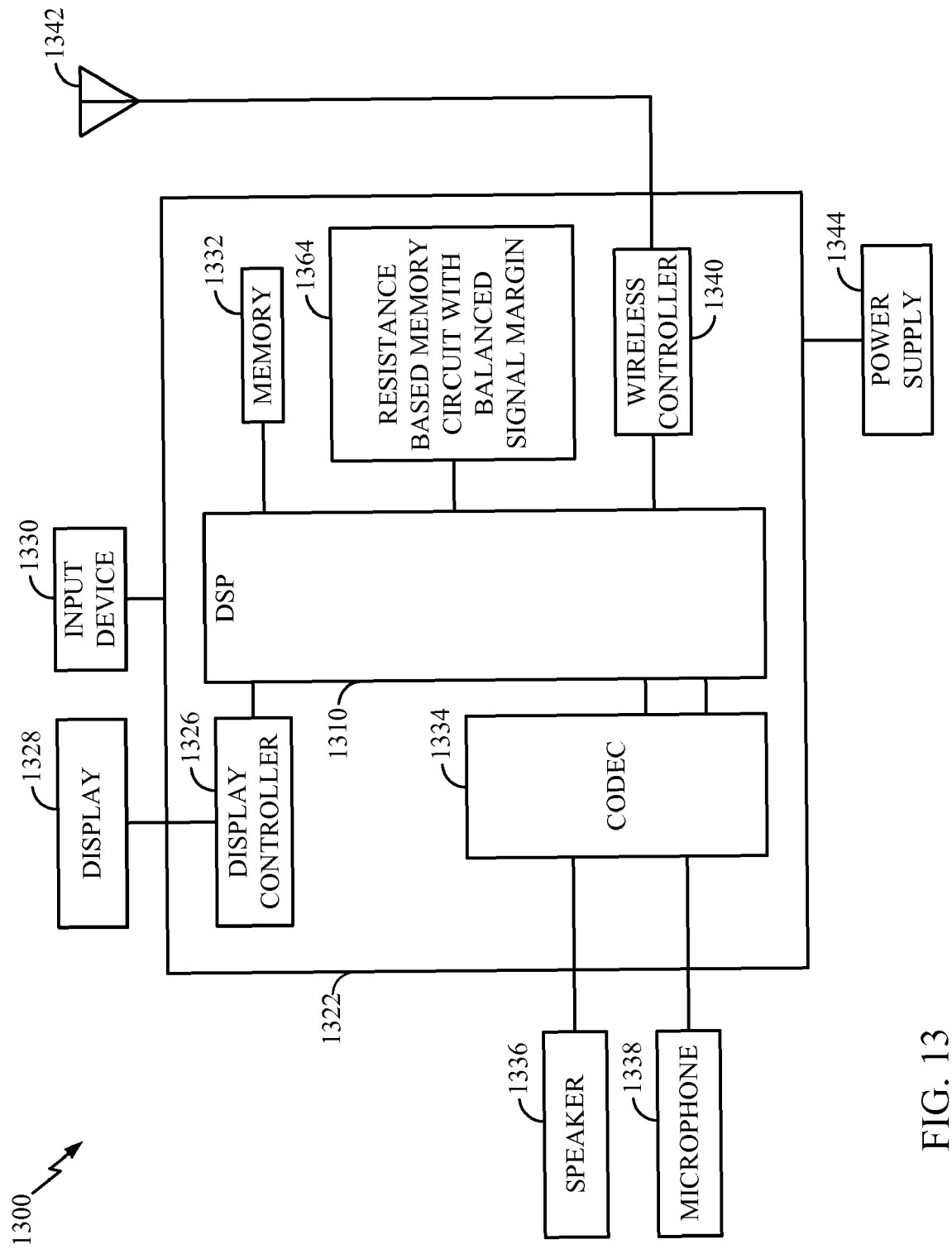
FIG. 13 is a block diagram of a particular illustrative embodiment of a wireless device including a resistance based memory circuit having an adjustable transistor load.

Referring to FIG. 13, a block diagram of a particular illustrative embodiment of an electronic device, such as a wireless phone, including a resistance based memory circuit with a balanced signal margin, as described herein, is depicted and generally designated 1300. The device 1300 includes a processor, such as a digital signal processor (DSP) 1310, coupled to a memory 1332 and also coupled to a resistance based memory circuit with a balanced signal margin 1364. In an illustrative example, the resistance based memory circuit with a balanced signal margin 1364 includes the memory depicted in FIG. 1, the memory depicted in FIG. 2, the memory depicted in FIG. 3, and has an adjustable transistor load determined using the method of FIG. 12, or any combination thereof. By improving sense amplifier margin, memory device yield may be improved. In a particular embodiment, the resistance based memory circuit with a balanced signal margin 1364 includes a spin torque transfer magnetoresistive random access memory (STT-MRAM) memory device.

FIG. 13 also shows a display controller 1326 that is coupled to the digital signal processor 1310 and to a display 1328. A coder/decoder (CODEC) 1334 can also be coupled to the digital signal processor 1310. A speaker 1336 and a microphone 1338 can be coupled to the CODEC 1334.

FIG. 13 also indicates that a wireless controller 1340 can be coupled to the digital signal processor 1310 and to a wireless antenna 1342. In a particular embodiment, the DSP 1310, the display controller 1326, the memory 1332, the CODEC 1334, the wireless controller 1340, and the resistance based memory circuit with load balancing 1364 are included in a system-in-package or system-on-chip 1322. In a particular embodiment, an input device 1330 and a power supply 1344 are coupled to the on-chip system 1322. Moreover, in a particular embodiment, as illustrated in FIG. 13, the display 1328, the input device 1330, the speaker 1336, the microphone 1338, the wireless antenna 1342, and the power supply 1344 are external to the on-chip system 1322. However, each can be coupled to a component of the on-chip system 1322, such as an interface or a controller.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), magnetoresistive random access memory (MRAM), phase-change random access memory (PRAM), or spin torque transfer MRAM (STT-MRAM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An amplifier comprising:
 a bit line coupled to read first data of a first resistance based memory cell with a first read margin and to read second data of the first resistance based memory cell with a second read margin; and
 a transistor load coupled to the bit line, wherein a characteristic of the transistor load is adjusted to modify at least one of the first read margin and the second read margin.

2. The amplifier of claim 1, wherein the resistance based memory cell includes a magnetorestrictive random access memory (MRAM) circuit, a phase-change random access memory (PRAM) circuit, or a spin torque transfer MRAM (STT-MRAM) circuit.

3. The amplifier of claim 1, wherein the characteristic of the transistor load is adjusted to substantially balance the first read margin and the second read margin.

4. The amplifier of claim 3, wherein after the characteristic of the load transistor is adjusted, a first statistical value corresponding to a first mean value and a first standard deviation value of the first read margin is substantially equal to a second statistical value corresponding to a second mean value and a second standard deviation value of the second read margin.

5. The amplifier of claim 1, wherein the first data corresponds to a logic zero value and wherein the second data corresponds to a logic one value.

6. The amplifier of claim 1, wherein the characteristic of the transistor load is a transistor width.

7. The amplifier of claim 1, wherein the first read margin is a logic zero read margin and the second read margin is a logic one read margin.

8. The amplifier of claim 1, wherein the characteristic of the load transistor is a transistor width and wherein the transistor width is reduced such that at least one of the first read margin and the second read margin is increased.

9. The amplifier of claim 1, wherein a reference voltage value remains substantially unchanged after modification of at least one of the first read margin and the second read margin.

10. A circuit comprising:
 a first transistor load of a data cell;
 a bit line coupled to the first transistor load and coupled to a data cell having a magnetic tunnel junction (MTJ) structure, wherein during a read operation the bit line has a first voltage value when the MTJ structure has a first logic state and a second voltage value when the MTJ structure has a second logic state; and a second transistor load of a reference cell, the second transistor load coupled to the first transistor load, the second transistor load having an associated reference voltage value;

wherein a characteristic of the first transistor load is adjustable to modify the first voltage value and the second voltage value, but without substantially changing the reference voltage value.

11. The circuit of claim 10, wherein the reference voltage value is a voltage of a gate of a transistor within the second transistor load.

12. The circuit of claim 10, wherein the characteristic is a transistor width.

13. The circuit of claim 10, wherein the first transistor load includes a load transistor component and a source degeneration transistor component.

14. The circuit of claim 13, wherein the source degeneration transistor component provides a negative feedback to the load transistor component.

15. The circuit of claim 14, wherein the source degeneration transistor component includes source degeneration transistors that are selectively gated off.

16. A circuit comprising:
a first transistor load of a data cell;
a bit line coupled to the first transistor load and coupled to a data cell having a magnetic tunnel junction (MTJ) structure, the bit line adapted to detect data having a logic one value when the bit line has a first voltage value, the bit line further adapted to detect data having a logic zero value when the bit line has a second voltage value; and
a second transistor load of a reference cell, the second transistor load coupled to the first transistor load, the second transistor load having an associated reference voltage value;
wherein the first transistor load includes at least one source degeneration transistor.

17. The circuit of claim 16, wherein the first transistor load includes at least one load transistor.

18. The circuit of claim 17, wherein the source degeneration transistor has a width selected such that a first read margin of the first voltage value is substantially balanced with respect to a second read margin of the second voltage value.

19. The circuit of claim 17, wherein the load transistor has a width selected such that a first read margin of the first voltage value is substantially balanced with respect to a second read margin of the second voltage value.

20. The circuit of claim 16, wherein a gate voltage is selectively applied to a gate of the source degeneration transistor during a read operation.

21. The circuit of claim 20, wherein the gate voltage is selectively shut off to reduce leakage current.

22. The circuit of claim 16, wherein a first read margin is based on the first voltage value as compared to a reference voltage value and wherein a second read margin is based on the second voltage value as compared to the reference voltage value.

23. A method of configuring a sense amplifier, the method comprising:
measuring a first read margin of a data cell having a magnetic tunnel junction (MTJ) structure;
measuring a second read margin of the data cell having the MTJ structure;
balancing the first read margin and the second read margin by adjusting a characteristic of a transistor load coupled to the data cell having the MTJ structure.

24. The method of claim 23, wherein the transistor load includes a load transistor component and a source degeneration transistor component.

25. The method of claim 24, wherein the source degeneration transistor component provides a negative feedback to the load transistor component.

* * * * *

UNITED STATES PATENT AND TRADEMARK OFFICE
CERTIFICATE OF CORRECTION

PATENT NO. : 7,889,585 B2  
APPLICATION NO. : 12/338297  
DATED : February 15, 2011  
INVENTOR(S) : Seong-Ook Jung et al.

Page 1 of 1

It is certified that error appears in the above-identified patent and that said Letters Patent is hereby corrected as shown below:

Title Page, Item [73], After the first assignee, please correct the following:

Industry-Academic Cooperation Foundation, Yonsei U, Seoul, Korea (KR)

To be listed as follows:

[73] Assignees: QUALCOMM Incorporated, San Diego, CA (US)
                 Yonsei University, Seoul, Korea (KR)

Signed and Sealed this
First Day of July, 2014

Michelle K. Lee
*Deputy Director of the United States Patent and Trademark Office*